United States Patent
Mazzamuto

(10) Patent No.: US 10,566,189 B2
(45) Date of Patent: Feb. 18, 2020

(54) DEEP JUNCTION ELECTRONIC DEVICE AND PROCESS FOR MANUFACTURING THEREOF

(71) Applicant: LASER SYSTEMS & SOLUTIONS OF EUROPE, Gennevilliers (FR)

(72) Inventor: Fulvio Mazzamuto, Paris (FR)

(73) Assignee: LASER SYSTEMS & SOLUTIONS OF EUROPE, Gennevilliers (FR)

( * ) Notice: Subject to any disclaimer, the term of this patent is extended or adjusted under 35 U.S.C. 154(b) by 0 days.

(21) Appl. No.: 16/305,735

(22) PCT Filed: May 31, 2017

(86) PCT No.: PCT/EP2017/063195
§ 371 (c)(1),
(2) Date: Nov. 29, 2018

(87) PCT Pub. No.: WO2017/207653
PCT Pub. Date: Dec. 7, 2017

(65) Prior Publication Data
US 2019/0214251 A1    Jul. 11, 2019

(30) Foreign Application Priority Data

May 31, 2016   (EP) .................................... 16172286

(51) Int. Cl.
*H01L 21/02*   (2006.01)
*H01L 21/268*  (2006.01)
*H01L 21/265*  (2006.01)

(52) U.S. Cl.
CPC .... *H01L 21/02381* (2013.01); *H01L 21/0257* (2013.01); *H01L 21/02532* (2013.01); *H01L 21/02675* (2013.01); *H01L 21/268* (2013.01); *H01L 21/2652* (2013.01)

(58) Field of Classification Search
CPC ......... H01L 21/02381; H01L 21/02532; H01L 21/02675; H01L 21/0257; H01L 21/268
USPC ....................................................... 438/478
See application file for complete search history.

(56) References Cited

FOREIGN PATENT DOCUMENTS

DE    10 2006 053182    5/2008

OTHER PUBLICATIONS

International Search Report, PCT/EP2017/063195, dated Oct. 5, 2017.

(Continued)

*Primary Examiner* — Elias Ullah
(74) *Attorney, Agent, or Firm* — Young & Thompson

(57) ABSTRACT

Disclosed is a process for manufacturing a deep junction electronic device including steps of: b) Depositing a layer of non-monocrystalline semiconductor material on a plane surface of a substrate of a monocrystalline semiconductor material; c) Incorporating inactivated dopant elements prior to step b) into said substrate (1) and/or, respectively, during or after step b) into said layer, so as to form an inactivated doped layer; d) Exposing, an external surface of the layer formed at step b) to a laser thermal anneal beam, so as to melt said layer down to the substrate and so as to activate said dopant elements incorporated at step c); e) Stopping exposure to the laser beam so as to induce epi-like crystallization of the melted layer, so that said substrate and/or, respectively, an epi-like monocrystalline semiconductor material, comprises a layer of activated doped monocrystalline semiconductor material.

20 Claims, 3 Drawing Sheets

(56) References Cited

OTHER PUBLICATIONS

Ong C et al: "A low-cost method of forming epitaxy SiGe on Si substrate by laser annealing", Appli Ed Physics Letters, A I P Publishing LLC, US, vol. 94, No. 8, Feb. 24 2009 (Feb. 24, 2009), pp. 82104-82104, XP012119194, ISSN: 0003-6951, D0I: 10.1063/1.3086881 the whole document.

DEEP JUNCTION ELECTRONIC DEVICE AND PROCESS FOR MANUFACTURING THEREOF

TECHNICAL FIELD OF THE INVENTION

The invention relates to a method for manufacturing integrated circuits (ICs) comprising a deep electronic junction.

More precisely the invention relates to a device and a method for forming a buffer layer in a deep electronic junction device at a low thermal budget.

BACKGROUND INFORMATION AND PRIOR ART

Deep junction devices are used in particular for manufacturing vertical power devices such as IGBT (Insulated Gate Bipolar Transistor) or power metal-oxide-semiconductor field-effect transistor (MOS also MOSFET, MOS-FET, or MOS FET).

Numerous documents describe devices and methods for forming deep electronic junction devices. IC fabrication is achieved by completing first the front-side processing steps and then pursuing with the backside processing steps. The front-side processing is the first portion of IC fabrication where a first part of the deep junction devices is patterned on the front side of a semiconductor wafer, and the back-side processing is the second portion of IC fabrication where the opposite part of the deep junction device is formed on the back side of the wafer. Backside processing generally begins when the front side structure is finished with metallization step.

The backside processing steps must thus be performed at a temperature lower than about 450° C. in order to preserve the electrical junction and the IC metallized structures formed on the front side of the substrate. Moreover, the backside processing is preferably achieved at a low thermal budget to reduce processing costs.

Within the present disclosure, a thermal budget of a processing step is defined as the product of the temperature by the duration of the processing step at that temperature. For instance, the thermal budget for a processing step of several minutes in an oven at a temperature of more than 1000° C. is extremely high, and incompatible with backside processing.

Vertical power devices require in particular formation of a deep doped buffer layer on the backside of an integrated circuit. Within the present disclosure, a deep layer means a layer buried at a distance in a range comprised between 500 nanometers to about 5 micrometers from the back surface of a substrate.

A known technique for forming a deep doped layer relies on the use of a standard implanter followed by thermal diffusion and activation. Standard implanters are based on accelerator systems and can be classified in the following two categories. Medium current accelerator systems generate ion beam currents between 10 pA and 2 mA, with an energy range comprised between 3 keV and several hundreds keV. High current accelerator systems generate ion beam currents up to about 30 mA, for energies up to 0.2 keV-180 keV. The implantation depth depends on the mass of the implanted species. Thermal diffusion consists in placing the substrate in an oven at a temperature superior to 700° C. for minutes or hours, which implies a high thermal budget. Thermal diffusion enables activating the dopants implanted deeply in the bulk of the substrate. However, this technique cannot be applied for forming a deep doped buffer layer on the backside of an IC, because thermal diffusion exposes the frontside of the sample to a high temperature and because its long duration (minutes or hours) turns into high thermal budget.

Today the standard technique for forming a deep doped buffer layer on the backside of an IC substrate is performed in two separate steps: a first step using a high energy implanter for implanting dopant elements into the substrate, in general a monocrystalline silicon wafer, and a second step, using laser thermal annealing (LTA) so as to activate the implanted dopants. The process of high energy implantation followed by LTA is generally achieved during backside processing steps of an integrated circuits (ICs) manufacturing line, after the last step of front-side processing. Within the present disclosure, high energy implantation means implantation of dopant ions, using an ion implanter or ion gun, at energy comprised in a range from 200 keV to several MeV. The implantation depth depends on the mass of the implanted specie. High energy implantation is necessary for implanting dopant elements directly into a buried layer in the bulk.

However, high energy implantation is expensive and strongly dependent on the dopant element. Moreover, laser thermal annealing, which is generally performed at low thermal budget, is limited to the activation of some dopant elements with a limited and specie-dependent diffusion.

Other processes rely on a double implantation scheme: a high energy implantation of a first dopant element at a distance of 1 to 2 micrometers from the surface followed by a shallow implantation of a second dopant element at a distance of about 500 nanometers from the surface, so as to form a p-n vertical electronic junction.

Patent document DE 10 2006 053182 A1 relates to a method for implanting aluminium or gallium dopants in silicon by steps of less than 500 nm depth, followed by a first laser annealing step, deposition of a capping layer, another laser annealing step and a drive-in step at a temperature higher than 750° C. Publication Ong et al. relates to "A low-cost method of forming epitaxy SiGe on Si substrate by laser annealing" APL, vol. 94 no. 8, 2009, p 82104-82104.

There is a need for a simpler backside process for forming deep electronic junction devices and/or vertical power devices while maintaining the frontside at relatively low temperature (less than about 450° C.). In particular, there is a need for forming a deep doped buffer layer on the backside of an integrated circuit at a low thermal budget.

SUMMARY OF THE INVENTION

Therefore one object of the invention is to provide a low thermal budget technique for forming a deep doped buffer layer on the backside of an integrated circuit.

The above objects are achieved according to the invention by providing a process for manufacturing a deep junction electronic device comprising the steps of:

a) Providing a substrate of a monocrystalline semiconductor material, said substrate having a plane surface;

b) Depositing a layer of a non monocrystalline semiconductor material on said plane surface, said layer of non monocrystalline semiconductor material having an external surface;

c) Incorporating inactivated dopant elements prior to step b) into said substrate and/or, respectively, during or after step b) into said layer of non monocrystalline semiconductor material, so as to form an inactivated doped layer of monocrystalline semiconductor material and/or, respectively, an inactivated doped layer of non monocrystalline semiconductor material;

d) Exposing, after the step c), an area of said external surface formed at step b) to a laser thermal anneal beam having a density of energy higher than a determined threshold, so as to melt the layer of non monocrystalline semiconductor material within a volume defined by said laser thermal anneal beam down to an interface with the substrate, and so as to activate said dopant elements incorporated at step c), e) Stopping exposure of said area to said laser thermal anneal beam so as to induce epi-like crystallization of said layer of non monocrystalline semiconductor material from said interface with the substrate up to the external surface and formation of epi-like monocrystalline semiconductor material extending over said volume between said interface and said external surface, and wherein said substrate and/or, respectively, said epi-like monocrystalline semiconductor material, comprises a layer of activated doped monocrystalline semiconductor material.

As a result, the epi-like monocrystalline semiconductor material and the layer of doped monocrystalline semiconductor material have the same crystalline lattice and crystalline orientation as the substrate of monocrystalline semiconductor material.

The step b) may be performed at low temperature, in general less than 500° C., and preferably less than 300° C., or even less than 250° C. The step c) may be performed by standard or low energy implantation and with a limited dose of implantation, and in any event not at high energy because of the shallow depth of dopant elements incorporation. Thus step c) does not require a high energy implanter nor a high dose of implantation.

In a particular embodiment detailed in the present disclosure, step c) may be performed during the step b) the dopants being deposited together with the non monocrystalline material with a precise stoichiometry.

The step d) produces a full melt of the non monocrystalline layer but this melting is spatially limited over an area determined by the laser beam size and limited in depth so as to melt the non monocrystalline layer down to the interface with the substrate. The melting does not propagate substantially within the substrate itself, and thus does not affect the opposite side of the substrate which is the front side of the electronic device. Moreover, the step d) is temporally limited by the laser pulse duration, thus this step lasts generally less than 1 second. Furthermore, the laser beam produces simultaneously local epi-like crystallization and efficient dopant activation.

In total, formation of a deep doped layer of monocrystalline semiconductor material buried in a monocrystalline substrate is thus obtained while maintaining the frontside at low temperature and with a very limited thermal budget. This process is simpler than previous backside processes, because it does not require a high energy implanter.

Furthermore, this process enables better control of the doping level and doping profile. It enables forming a doped layer having a dopant profile which is not achievable using prior art methods.

As a result, this process enables forming a deep buffer layer of doped monocrystalline semiconductor material at a low thermal budget.

This process may be applied on the backside surface of a substrate, having a patterned front side, for example for forming IGBT or MOSFET devices.

This process is applied locally on a surface area limited by the area of the laser beam, and may be applied using a step and repeat method to an adjacent area of a same substrate. Preferably, the step of irradiating the backside surface with a laser beam comprises irradiating at least two selected regions of the backside surface with only one laser pulse for each selected region, the two selected regions overlapping by at most 1%.

The process of the present disclosure provides a better control of the profile of a deep doped buffer layer.

According to a particular and advantageous aspect of the invention, during step d) said laser beam is an excimer laser beam having a laser wavelength in the range of absorption of said non monocrystalline semiconductor material.

According to another particular aspect, the step c) comprises a step c1) which is performed after step a) and prior to step b), said step c1) comprising exposure of said surface of the substrate to an ion implantation beam having an energy lower than several hundreds keV (as defined by the capability of standard implanters) so as to implant said inactivated dopant elements into the monocrystalline semiconductor substrate and to form a layer of monocrystalline semiconductor material doped by said inactivated dopant elements and extending from said plane surface into the monocrystalline semiconductor substrate.

According to another particular aspect, the step c) comprises a step c2) which is performed during step b), said step c2) comprising the incorporation of dopant elements into the layer of non monocrystalline semiconductor material.

According to still another particular aspect, the step c) comprises a step c3) which is performed after the steps a) and b), said step c3) comprising exposure of said layer of non monocrystalline semiconductor material to an ion implantation beam so as to implant said inactivated dopant elements into the layer of non monocrystalline semiconductor material and to form a layer of non monocrystalline semiconductor material doped by said inactivated dopant elements.

According to a particular embodiment, the layer of activated doped monocrystalline semiconductor is doped with a first dopant type and the layer of activated doped epi-like monocrystalline semiconductor is doped with a second dopant type.

According to a preferred embodiment, the process further comprises another step of cleaning said surface of the substrate prior to step b) so as to remove any oxide layer from said surface.

According to a particular and advantageous aspect of the invention, the substrate is made of crystalline silicon and/or the non monocrystalline layer is made of amorphous or poly-crystalline silicon, and/or the semiconductor material is selected among silicon and germanium.

According to another particular and advantageous aspect of the invention, said step c) of incorporating inactivated dopant elements is achieved so as to incorporate dopant elements with a gradient profile along a direction transverse to the plane surface of the substrate.

According to an embodiment, the epi-like crystalline semiconductor layer is n-doped and the crystalline semiconductor substrate is p-doped at the interface with the epi-like crystalline semiconductor layer.

According to another embodiment, the epi-like crystalline semiconductor layer is p-doped and the crystalline semiconductor substrate is n-doped at the interface with the epi-like crystalline semiconductor layer.

According to a preferred embodiment, the layer of epi-like monocrystalline semiconductor material has a thickness comprised between 500 nanometers and 3 micrometers.

According to another particular and advantageous aspect of the invention, said step d) comprises exposing said layer of non monocrystalline semiconductor material to an excimer laser beam having an energy density in the range from 0.1 to 10 J/cm$^2$ and a laser wavelength lower than 600 nanometers.

Preferably, the steps d) and e) are performed in a gaseous atmosphere selected among an inert gas, air or vacuum and under controlled pressure and temperature.

As an option, the process further comprises a step of measuring an optical beam reflected on the external surface of the layer of non monocrystalline semiconductor material so as to control full melt of said layer of non monocrystalline semiconductor material during said step d), and so as to control epi-like crystallization of said layer during said step e).

A further object of the invention is to use the process of the invention for forming vertical transistor device selected among insulated gate bipolar transistor or power metal-oxide-semiconductor field effect transistor.

A further object of the invention is to provide a deep junction electronic device comprising a monocrystalline semiconductor substrate, comprising a layer of epi-like monocrystalline semiconductor material having an external surface and an interface with said monocrystalline semiconductor substrate, and wherein said monocrystalline semiconductor substrate, and/or, respectively, said layer of epi-like monocrystalline semiconductor material, comprises a layer of activated doped monocrystalline semiconductor material, wherein said interface is located at a depth comprised between 1 micrometer and 5 micrometers from said external surface and wherein the doping profile of said layer of activated doped monocrystalline semiconductor material is a non-Gaussian profile. As an example, the thickness of said monocrystalline layer of doped semiconductor material is comprised between several hundred of nanometers and 2 micrometers. Preferably, the monocrystalline layer of doped semiconductor material has a controlled doping level profile selected among: a step-like profile, a triangular profile, a gradient profile, a Gaussian profile.

The present invention also concerns the features disclosed in the following description and which are to be considered alone or according to any possible technical combination.

BRIEF DESCRIPTION OF THE DRAWINGS

This description is given for non limiting illustrative purposes only and will be better understood when referring to the annexed drawings wherein.

DETAILED DESCRIPTION OF EXAMPLE(S)

Process

Figure 1:
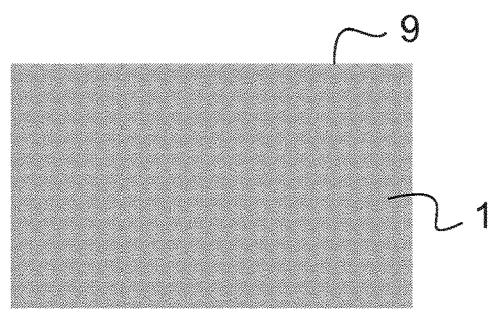
FIG. 1 represents a cross-sectional view of a monocrystalline semi-conductor substrate, according to prior art.
Figure 2:
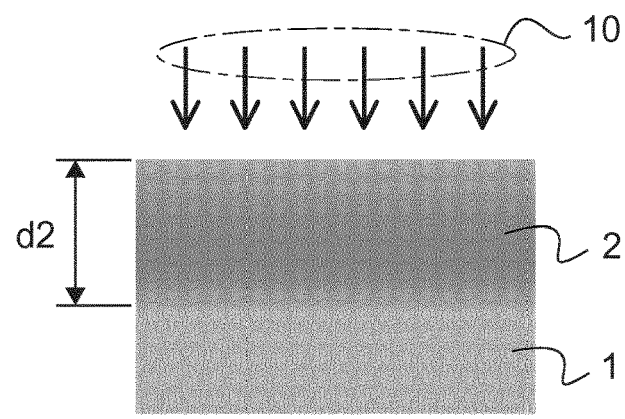
FIG. 2 represents a step of high energy implantation of dopant elements into a semi-conductor substrate, according to prior art.
Figure 3:
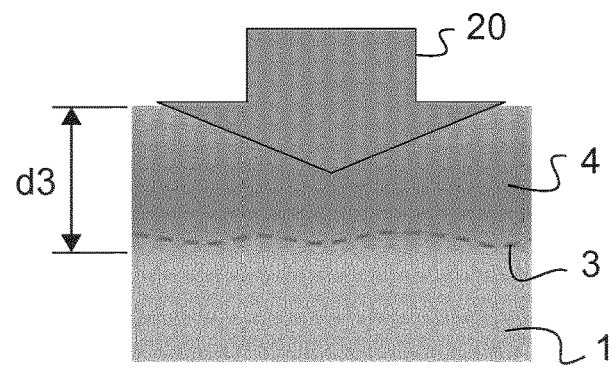
FIG. 3 represents a step of laser thermal anneal according to prior art.

FIGS. 1-3 represent schematically a process according to the prior art for forming a deep doped buffer layer in a crystalline substrate 1, for example a monocrystalline silicon wafer.

The monocrystalline substrate 1 is used for forming power electronic devices having a vertical electronic junction, wherein a transistor has two contact regions, for example gate and emitter on a front side of the substrate, and at least another contact, for example the collector, on a backside of the substrate. Vertical power devices require the formation of different doped layers on the front side surface and on the back side of the substrate 1.

The substrate 1 is generally made of a monocrystalline semiconductor material, preferably crystalline silicon (c-Si) or germanium (c-Ge). The substrate 1 has a flat surface 9 having a determined crystallographic orientation, for example (111) or (100). For example, the flat surface 9 represents the back side surface of a patterned wafer having IC features on the opposed front side.

FIGS. 1-3 illustrate a conventional process for forming a deep doped buffer layer on the surface 9 of a crystalline substrate 1. Today, the conventional technique comprises a first step of high energy implantation (FIG. 2) and a second step of laser anneal for activating the dopants at low thermal budget (FIG. 3).

On FIG. 2, the high energy implantation step consists in exposing the backside surface 9 of the crystalline substrate 1 to a high energy implant beam 10 for implanting ions of dopant elements into the substrate. For example, in a monocrystalline silicon substrate 1, high energy implantation is used for implanting dopant elements selected depending on the application among: boron, phosphorus, arsenic, aluminium, gallium, indium, thallium, antimony and bismuth. The doped layer 2 is buried and extends at a distance of about 2 to 5 micrometers from the backside surface 9. The buried layer 2 thus formed comprises inactivated dopant elements and has a thickness d2 comprised between 2 and 5 micrometers, generally with a Gaussian doping level profile. However, high energy implantation is expensive and strongly depends on the dopant element. For example, implantation of phosphorus atoms is used for forming an n doped buffer layer. High energy implantation of phosphorus ions means implanting phosphorus ions having an energy comprised in a range between 500 keV and several MeV. The Gaussian profile (sigma and peak) depends on the features of the ion beam implanter. Controlling the angle of incidence of the ion beam enables adjustment of the peak position of the Gaussian doping profile within a rather limited range. Furthermore, the implanted ions are inactivated.

On FIG. 3, the second step consists in activating the implanted dopant elements. FIG. 3 illustrates a step of thermal anneal, for example using a laser. A laser beam 20 is directed toward the backside surface 9 of the substrate 1. The laser beam 20 has a determined power density so as to activate the implanted dopant elements in the buried layer 2, thus forming a monocrystalline layer 4 of doped semiconductor material. For example, the laser beam 20 is an excimer laser beam having a wavelength in the visible or UV range, preferably between 250 nm and 355 nm, a pulse duration in the nanosecond to sub-microsecond range, generally between 50 ns and 200 ns, and preferably between 130 ns and 180 ns. The laser pulse presents a geometrical cross-section greater than 25 mm$^2$, preferably greater than 200 mm$^2$. The excimer laser beam produces a shallow heating, limited to a depth of about 10 nanometers for a UV laser beam to about 1 micrometer for a visible laser beam. These operating conditions avoid thermal diffusion within the substrate. However, the excimer laser beam does not produce melting through the crystalline substrate up to the front side, so as to prevent deteriorating the front side layers. Depending on the dopant element, the laser beam 20 may induce a limited diffusion of the dopant elements up to an interface 3 within the substrate 1. Indeed, Hight is absorbed in a first layer depending on the laser wavelength and the material exposed almost independently from the dopants. It is the laser energy density applied that really controls the penetration of the annealing trough the melting depth. Consequently also the dopants should be within the melting depth or adjacent to the melting region so as to be activated.

Figure 4:
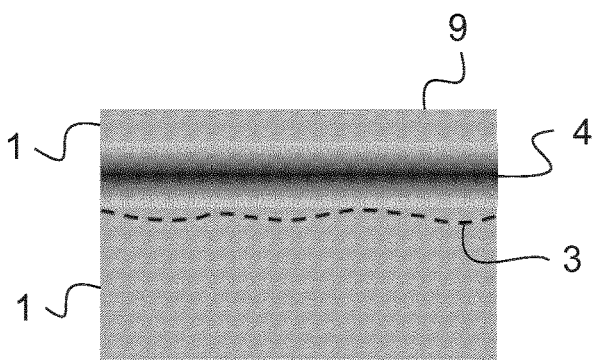
FIG. 4 represents in cross-section a deep doped buffer layer in a crystalline silicon wafer resulting from the process steps illustrated on FIGS. 1-3.

FIG. 4 illustrates a cross section view of a substrate 1, comprising a monocrystalline layer 4 of doped semiconductor material obtained as a result of the high energy implantation and laser thermal anneal steps illustrated on FIGS. 2 and 3. The monocrystalline layer 4 of doped semiconductor material has a thickness comprised in the range few hundreds of nanometers to 5 micrometers. The interface 3 between the doped layer 4 and the substrate 1 is at a distance of about 1 to 5 micrometers from the backside surface 9 of the substrate 1.

However, high energy implantation is expensive and strongly dependent on the dopant element. Moreover, low thermal budget anneal is just able to activate the dopants with a limited and specie-dependent diffusion.

This process is generally achieved in a manufacturing line of integrated circuits (ICs) during back-side processing steps. This process is achieved after the last step of the front-side processing. The backside processing steps are thus performed at low thermal budget in order to preserve the IC structures already formed on the front side of the substrate.

Nevertheless, a deep doped buffer layer cannot be formed on the backside by using standard implanter followed by thermal diffusion, because thermal diffusion implies a high thermal budget (temperature above 700° C. for a duration of minutes up to hours) exceeding the thermal budget limitation devoted to backside processing. Within the present disclosure, standard energy implantation means implanting dopant elements with an energy range comprised between several hundreds eV and several hundreds keV.

The present disclosure proposes alternative processes for forming a deep doped buried layer at a low thermal budget.

First Embodiment

Figure 5:
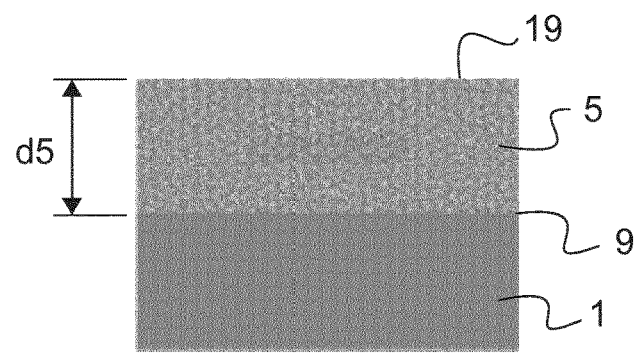
FIG. 5 represents in cross-section a processing step b) or a combination of steps b) and c), according to a first embodiment of deposition of non monocrystalline semiconductor layer on a crystalline substrate.
Figure 6:
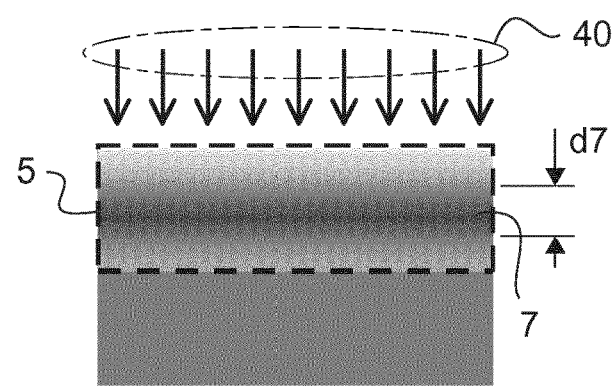
FIG. 6 represents a step c) according to a variant of the first embodiment of incorporation of dopant elements into the non monocrystalline semiconductor layer by standard or low energy implantation.
Figure 7:
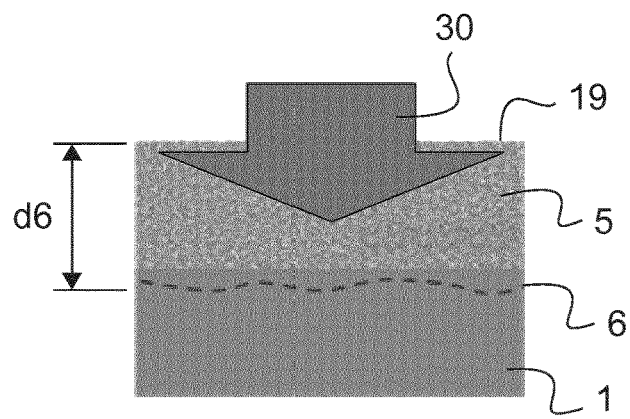
FIG. 7 represents a step d) of laser thermal anneal according to the first embodiment of the invention.
Figure 8:
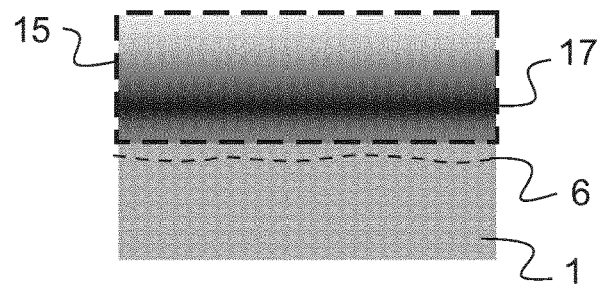
FIG. 8 represents in cross-section a layer of epi-like monocrystalline doped semiconductor on the back side of a monocrystalline substrate resulting from the process steps illustrated on FIGS. 5 and 7, or on FIGS. 5, 6 and 7.

FIGS. 5 to 7 illustrate a process for forming a doped buried layer according to a first embodiment, and FIG. 8 illustrates the resulting structure.

Prior to the steps illustrated on FIGS. 5 to 7, a monocrystalline semiconductor substrate 1 having a plane surface 9 is provided (as illustrated on FIG. 1). The monocrystalline semiconductor substrate 1 is for example a crystalline silicon (c-Si) substrate or a crystalline germanium (c-Ge) substrate. The plane surface 9 is for instance obtained by chemical mechanical polishing or any other known technique. The plane surface 9 has a determined crystallographic orientation, for example (111) or (100).

FIG. 5 illustrates a step of deposition of a layer 5 of non monocrystalline semiconductor material on the plane surface 9 of the monocrystalline semiconductor substrate 1. The semiconductor material of the layer 5 and of the substrate 1 have same crystalline lattice. Preferably, the layer 5 and the substrate 1 are made of a same semiconducting material, for example silicon or germanium. For instance, the layer 5 of non monocrystalline semiconductor material is made of amorphous silicon or polysilicon silicon. The deposition step of the layer 5 may be performed using known methods of thin film deposition such as sputtering, chemical vapor deposition (CVD), or plasma enhanced chemical vapor deposition (PECVD).

The layer 5 of non monocrystalline semiconductor material has a thickness d5 in the range of few hundreds nanometers to few micrometers (3 µm could be the upper limit). The layer 5 has an external surface 19. The surface 9 of the substrate 1 now forms an interface with the layer 5 of non monocrystalline semiconductor material.

FIG. 6 illustrates an alternative or optional step of doping using a standard energy ion implantation beam 40. In the case where the layer 5 is doped during deposition, the step of ion implantation is optional. The step of ion implantation consists in directing an ion implant beam 40 on the external surface 19 of the non monocrystalline semiconductor layer 5. Dopant elements are implanted in the non monocrystalline semiconductor layer 5 thus forming a layer 7 including inactivated dopant elements located inside the non monocrystalline semiconductor material and/or inside the monocrystalline substrate 1. The inactivated doped semiconductor non monocrystalline layer 7 has a thickness d7 comprised between a few hundreds of nanometers and a few micrometers. Inside the doped semiconductor non monocrystalline layer 7, the dopant concentration profile may be approximately constant, or may follow a gradient curve, depending in particular on the dopant species and on the ion implantation energy.

It is to be observed that the dopant elements incorporated in the non monocrystalline semiconductor layer 5 are inactivated after the step of ion implantation.

Standard energy implantation is available at lower costs than high energy implantation, is compatible with numerous dopant elements and offers stability versus the dopant element species.

After incorporation of the dopant elements, FIG. 7 represents a step of laser thermal anneal applied to the layer 5 of non monocrystalline semiconductor material. More precisely, a laser beam 30 is directed toward the external surface 19 of the non monocrystalline semiconductor layer 5, this layer being doped homogeneously or comprising an inner doped layer 7.

The laser beam 30 is for example a pulsed excimer laser beam, having a wavelength, pulse duration and energy selected so as to be absorbed by the non monocrystalline semiconductor layer 5. The laser beam 30 has a density of energy higher than a determined threshold so as to produce a full melt of the non monocrystalline layer 5 over the depth d6 extending from the external surface 19 down to an interface 6 inside the monocrystalline substrate 1. Simultaneously, the laser beam 30 induces activation of the dopant elements present in the doped layer 5 and/or implanted in the doped non monocrystalline layer 7. However, the laser beam 30 does not induce substantial in-depth melting of the monocrystalline substrate 1, thus preserving the opposite side of the substrate. Moreover, the laser thermal anneal beam produces melting and dopant activation over an area which is spatially limited by the laser beam dimensions. As an example, a single laser pulse 30 with wavelength less than 1050 nm induces local heating at a temperature higher than the melting point of silicon at 1414° C. The laser pulse is thus suitable for melting the layer 5 of amorphous silicon or poly-silicon over a thickness of up to several micrometers, for example up to 5 micrometers. The laser pulse has a density of energy which is adjustable depending on the thickness of the layer 5 so that melting occurs down to the interface with the monocrystalline substrate or slightly under this interface without extending substantially into the monocrystalline substrate.

The laser thermal anneal step d) is stopped when the non monocrystalline semiconductor layer 5 is fully melted down to the interface 9 with the monocrystalline substrate 1. The depth of the laser thermal annealing may be controlled a posteriori by measuring the dopant profile, since laser thermal anneal also serves for dopant activation. In depth dopant elements remain inactivated in the bulk silicon material which has not been irradiated. A reflectometry instrument may be used to control the physical state (solid or liquid) of the epi-like layer.

This laser thermal anneal step is performed at a limited thermal budget because the laser pulses are limited in duration and because the melting depth is limited to the thickness of the non monocrystalline layer 5, and also limited laterally by the size of the laser beam 30.

After stopping the laser thermal anneal step, the melted semiconductor layer cools down immediately, and more precisely in less than few hundreds of nanoseconds up to less than 1 second. The reduction of temperature occurs by natural convection with surrounding atmosphere and/or by conduction with the substrate. Preferably, the substrate is placed on a sample stage including a system able to control the substrate temperature and the temperature in contact with the wafer. As soon as the temperature of the melted layer decreases below the solidus temperature of the semiconductor material, the layer solidifies by crystallizing. Crystallization originates from the monocrystalline substrate. The flat surface 9 of the monocrystalline substrate 1 serves a seed for epi-like crystallization. More precisely, the non monocrystalline layer 5 crystallizes into an epi-like monocrystalline semiconductor layer 15. This epi-like monocrystalline semiconductor layer 15 is doped with active dopants and/or includes a buried doped layer 17 with active dopants.

The step b) of deposition of non monocrystalline semiconductor layer is achieved in a deposition chamber depending on the deposition technique used. When the step c) of dopant incorporation is achieved during the step b) of deposition, the step c) is also achieved in the deposition chamber. The steps d) of laser thermal anneal and e) of epi-like crystallization are generally made in another reaction chamber or in air. Preferably, the processing steps d) and e) are performed under controlled temperature and pressure, for example in low pressure conditions and/or in an atmosphere consisting of inert gas.

This first embodiment of a process for forming a deep doped layer in a monocrystalline substrate avoids the use of a high energy implanter and thus avoids creation of impact defects such as end of range defects.

Moreover, the laser thermal anneal enables full doping activation. As a result, this process provides better profile control of the vertical device structure.

According to a variant of the first embodiment, the incorporation of dopant elements inside the layer 5 of non monocrystalline semiconductor material is achieved during the deposition step (illustrated on FIG. 5). For example, the layer 5 is doped using a mixture of precursor gases during a sputtering, CVD or PECVD deposition step. The advantage of doping during the deposition of the layer 5 is to enable controlling the doping profile inside the layer 5. Moreover, this variant of the first embodiment avoids the use of an ion implanter, even of standard or low energy, for implanting dopant elements, thus reduces manufacturing cost. In an example, the doping of the layer 5 is homogeneous over the whole thickness d5 of this layer 5, thus forming an n-doped or p-doped layer 5 of non monocrystalline semiconductor material. In another example, the dopant species concentration varies during the deposition step, thus resulting in a gradient of dopant concentration inside the layer 5 in a direction perpendicular to the plane surface 9 of the substrate 1. As a result for example, after the deposition step, the layer 5 comprises a layer of undoped non monocrystalline semiconductor material and another inner layer 7 of doped non monocrystalline semiconductor material. After deposition of the layer 5 of non monocrystalline semiconductor material is completed, the layer 5 has a thickness d5 comprised in a range between a few hundreds of nanometers and about 5 micrometers. Then, the process resumes with the step of laser thermal anneal (FIG. 7). A laser beam 30 is directed toward the external surface 19 of the layer 5 of non monocrystalline semiconductor, this layer being doped homogeneously or comprising an inner doped layer 7.

Similarly, as described in relation with FIG. 7, the laser beam 30 is selected for having a wavelength, pulse duration, and energy so as to be absorbed by the non monocrystalline semiconductor layer 5. The laser beam 30 is for example a pulsed excimer laser beam. The laser beam 30 produces a full melt of the non monocrystalline layer 5 over a depth d6 extending from the external surface 19 down to the interface with the monocrystalline substrate 1. Simultaneously, the laser beam 30 induces activation of the dopant elements present in the doped layer 5 and/or in the inner doped non monocrystalline layer 7. Generally, the laser beam 30 does not induce substantial in-depth melting of the monocrystalline substrate 1. Moreover, the laser thermal anneal beam produces melting and dopant activation over an area which is spatially limited both sideways and in depth by the laser beam features such as dimensions and density of energy. After the single laser pulse irradiation, the non monocrystalline semiconductor layer 5 is fully melted down to the interface 9 with the monocrystalline substrate 1. After stopping the laser thermal anneal step, the melted semiconductor layer cools and solidifies by crystallizing. The monocrystalline substrate 1 serves a seed for epi-like crystallization. More precisely, the non monocrystalline layer 5 crystallizes into an epi-like monocrystalline semiconductor layer 15. This epi-like monocrystalline semiconductor layer 15 is doped with active dopants or includes an inner doped layer 17 with active dopants.

As illustrated on FIG. 8, it is thus obtained a vertical structure comprising a monocrystalline semiconductor substrate 1 and a doped epi-like monocrystalline semiconductor layer 15. Alternatively, the stack comprises an undoped epi-like monocrystalline semiconductor layer 15 including a buried doped semiconductor epi-like monocrystalline layer 17. The epi-like monocrystalline semiconductor layer 15 has an interface with the monocrystalline semiconductor substrate 1. The layer(s) 15, 17 of doped epi-like monocrystalline semiconductor material have the same crystalline lattice and crystallographic orientation as the substrate 1.

This structure has excellent conductivity properties.

On the front side of the substrate, other doped areas may have been formed during front-side processing steps, thus enabling to obtain a junction device having excellent electronic properties such as low junction leakage.

As an alternative, the laser anneal may induce deeper melt into the monocrystalline substrate, for example from few tens nanometers to 3 μm in depth. This can be used to diffuse existing dopants in the non-monocrystalline into the melted layer of monocrystalline substrate.

Second Embodiment

Figure 9:
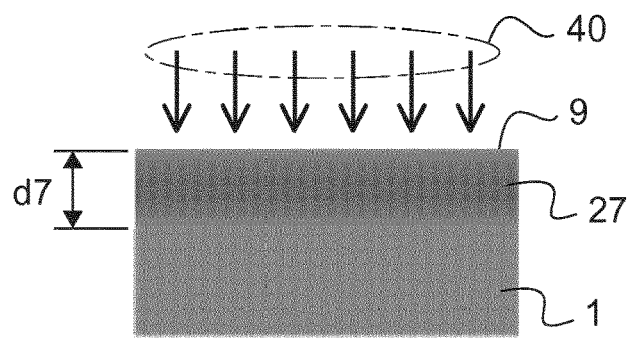
FIG. 9 represents a step c) of standard or low energy implantation of dopant elements into a semi-conductor substrate, according to another particular embodiment of the invention.
Figure 10:
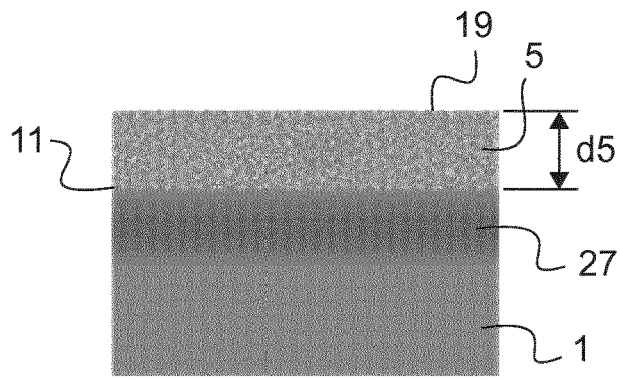
FIG. 10 represents in cross-section another step b) of deposition of non monocrystalline semiconductor layer on the substrate after the step c) illustrated on FIG. 9.
Figure 11:
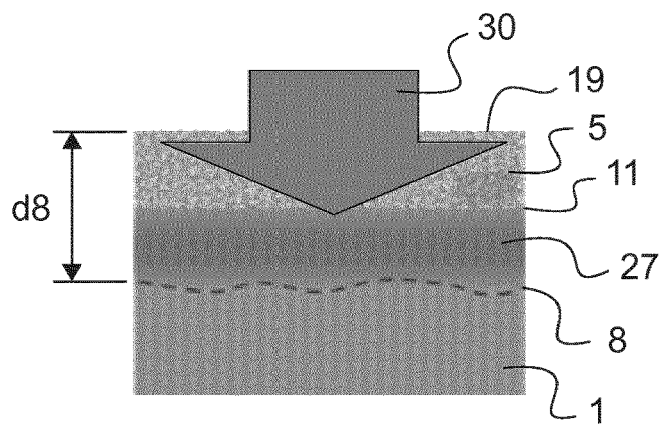
FIG. 11 represents a step d) of laser thermal anneal following the step c) illustrated on FIG. 10.
Figure 12:
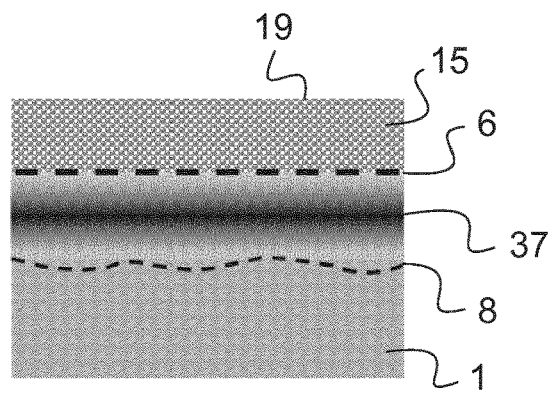
FIG. 12 represents in cross-section a deep buffer layer on the back side of a crystalline substrate resulting from the process steps illustrated on FIGS. 9-11.

FIGS. 9 to 11 illustrate a process for forming a doped buried layer according to a second embodiment, and FIG. 12 illustrates the resulting structure.

Prior to the steps illustrated on FIGS. 9 to 11, a monocrystalline semiconductor substrate 1 having a plane surface 9 is provided (as represented on FIG. 1).

On FIG. 9, a standard energy implanter is used for implanting dopant ions in a monocrystalline substrate 1. As an example known in the art, phosphorus ions are implanted for generating n type doping or boron ions are implanted for generating n type doping in silicon. An ion implant beam 40 is directed on the back surface 9 of the substrate 1. Preferably, the surface 9 is flat and polished. Dopant species are implanted in the monocrystalline substrate 1 thus forming a layer 27 of monocrystalline semiconductor material including inactivated dopant elements. The layer 27 has a thickness d7 comprised between few hundreds nanometer (i.e. 500 nm) and few micrometers (i.e. 3 μm). In other words, the layer 27 extends from the back surface 9 down a depth comprised between few hundreds nanometer (i.e. 500 nm) and few micrometers (i.e. 3 μm). Inside this layer 27, the inactivated dopant concentration profile may be approximately constant, or may follow a gradient curve from the back surface 9 up to the depth d7, depending in particular on the dopant species and on the ion implantation energy.

FIG. 10 represents a deposition step, which is applied on the surface 9 after the step of standard energy implantation illustrated on FIG. 9. A layer 5 of non monocrystalline semiconductor material is deposited on the flat surface 9 of the monocrystalline substrate 1. The semiconductor materials of the layer 5 and of the substrate 1 have the same crystalline lattice, and preferably are made of the same semiconducting material. For example, the monocrystalline substrate 1 is made of crystalline silicon, and the non monocrystalline layer 5 is made of amorphous or polycrystalline silicon. The non monocrystalline layer 5 is deposited at low temperature, preferably at a temperature lower than 500° C., for example by sputtering, chemical vapor deposition or plasma enhanced chemical vapor deposition. The non monocrystalline layer 5 is generally intrinsic or undoped. Alternatively, the non monocrystalline layer 5 may be doped with the same or another dopant element, and/or another dopant element concentration as compared to the layer 27 of monocrystalline semiconductor with inactivated dopant elements (see third embodiment below).

The stack obtained comprises a monocrystalline substrate 1 including a layer 27 of monocrystalline semiconductor with inactivated dopant elements and a layer 5 of non monocrystalline semiconductor. The non monocrystalline layer 5 has a thickness d5 comprised between 1 micrometer and 3 micrometers. The surface of the monocrystalline substrate 1 forms an interface 11 with the non monocrystalline layer 5. The non monocrystalline layer 5 has an external surface 19, generally parallel to the interface 11 with the substrate 1.

FIG. 11 represents a laser irradiation which is applied on the backside of the substrate 1, after the deposition step illustrated on FIG. 10. A laser beam 30 is directed onto the external surface 19 of the non monocrystalline layer 5. Preferably, the laser beam 30 is a single pulse excimer laser beam, having a wavelength, pulse duration, and energy range selected so as to be absorbed by the non monocrystalline semiconductor layer 5. The laser beam 30 has a density of energy higher than a determined threshold so as to produce a spatially limited melt of the non monocrystalline layer 5 from the external surface 19 down to the interface 11 with the substrate 1. Simultaneously, the laser beam 30 induces activation of the dopant elements implanted in the monocrystalline layer 7 over a depth d8, down to an interface 8 inside the monocrystalline substrate 1. The thickness d8 is comprised between few nanometers (for example 10 nm) and 5 μm, and preferably between 500 nm and 5 μm. However, the laser beam 30 does not induce melting of the monocrystalline layer 7 or monocrystalline substrate 1. Moreover, the laser thermal anneal beam produces melting and dopant activation over an area which is spatially limited by the laser beam dimensions.

The laser thermal anneal step is interrupted when the non monocrystalline semiconductor layer 5 is fully melted down to the interface 11. A reflectometry instrument may be used to control the physical state (solid or liquid) of the non monocrystalline layer 5.

This laser thermal anneal step is performed at a limited thermal budget because the laser pulses are limited in duration and because the melting depth is limited to the thickness of the non monocrystalline layer 5, and also limited laterally by the size of the laser beam 30.

After stopping the laser thermal anneal step, the melted semiconductor layer cools and solidifies by crystallizing. The interface 11 has a defined crystallographic orientation, for example (111), because the underlying substrate is also monocrystalline. This interface 11 serves a seed for epi-like crystallization. More precisely, the non monocrystalline layer 5 crystallizes into an epi-like crystallized semiconductor layer 15.

As illustrated on FIG. 12, it is thus obtained a stacked structure comprising a monocrystalline semiconductor substrate 1, a buried doped semiconductor monocrystalline layer 17 having a first interface 8 with the monocrystalline semiconductor substrate 1 and a second interface 6 with an epi-like crystallized semiconductor layer 15, placed between the epi-like crystallized semiconductor layer 15 and the monocrystalline semiconductor substrate 1.

This structure has excellent conductivity properties.

Third Embodiment

A third embodiment consists in a combination of the first and second embodiments. In a first step of the third embodiment, similar to the description in relation with FIG. 9, standard energy implantation is applied to a flat surface 9 of a monocrystalline substrate 1 for implanting dopant elements in the substrate, thus forming a layer 27 of monocrystalline semiconductor material with inactivated doped elements of a first doping type. Then, a layer 5 of non monocrystalline semiconductor material is deposited on the flat surface 9 of the substrate 1. In this third embodiment, the layer 5 may be intrinsic, undoped or doped with inactivated dopant elements of the same doping type or a second doping type. This doping of layer 5 may be performed during deposition of the layer 5 or using another standard energy implantation step, after deposition of the layer 5 (as illustrated on FIG. 6).

Then, a laser thermal anneal beam 30 is applied to the external surface 19 of the layer 5 of non monocrystalline semiconductor material doped with inactivated dopant elements of a second doping type. The density of energy of the laser thermal anneal beam 30 is selected so as to produce a full melt of the layer 5 down to the interface 11 with the substrate 1. Moreover, the laser thermal anneal beam 30 induces simultaneous activation of the dopant elements of second doping type in the layer 5 and of the dopant elements of the first doping type in the layer 27.

After full melt of the layer, the laser anneal beam 30 is interrupted so as to induce epi-like crystallization of the non monocrystalline layer. Thus, it is obtained a stacked structure comprising a bulk monocrystalline semiconductor substrate 1, a buried first type doped monocrystalline semiconductor layer 37 and a second type doped epi-like monocrystalline semiconductor layer 15. The first type doped monocrystalline semiconductor layer 37 is placed between the bulk substrate 1 and the second type doped epi-like monocrystalline semiconductor layer 15.

A vertical electronic junction device is thus formed at a low thermal budget.

Those skilled in the art will consider possible repetition and/or combination of one or several steps as disclosed herein. For example, a process may comprise a step c1) of implantation a first dopant element inside the substrate; and a step d1) of laser thermal anneal of the first dopant elements implanted in the substrate; and a step b) and c2) comprising deposition of a layer 5 doped with a second dopant element and a step d2) LTA of laser thermal anneal of the second dopant elements inside the amorphous or poly-crystalline layer 5; and a step e) of epi-like crystallization.

Device

The invention applies to the manufacturing of deep junction devices, such as IGBT, power MOS, diodes and other microelectronics devices.

The invention enables fabrication of deep electronic junction devices at a low thermal budget.

In a first embodiment, the device comprises a substrate 1 of a monocrystalline semiconductor material and a layer 15 of a doped epi-like monocrystalline semiconductor material.

In the first embodiment, the layer 15 of doped epi-like monocrystalline semiconductor material has a thickness comprised in a range of 500 nm to 3 µm.

In a variant of the first embodiment, the device comprises a substrate 1 of a monocrystalline semiconductor material, a layer 15 of undoped epi-like monocrystalline semiconductor material, and a layer 17 of doped epi-like monocrystalline semiconductor material placed between a flat surface of the substrate 1 and the layer 15. Each layer 15 and 17 has a thickness comprised in a range of 500 nm to 3 µm.

According to an embodiment, the doped layer 15 or 17 of epi-like monocrystalline semiconductor material has a spatially uniform dopant density. According to another embodiment, the doped layer 15 or 17 of epi-like monocrystalline semiconductor material has a gradient dopant profile in a direction transverse to the plane surface of the substrate 1.

In a second embodiment, the device comprises a substrate 1 of a monocrystalline semiconductor material including a layer 37 of doped monocrystalline semiconductor material placed underneath a flat surface of the substrate 1, and a layer 15 of epi-like monocrystalline semiconductor material. Each layer 15 and 37 has a thickness comprised in a range of 500 nm to 3 µm.

In a variant of the second embodiment, the layer 37 of doped monocrystalline semiconductor material is doped with a first dopant type and the layer 15 of epi-like monocrystalline semiconductor material is doped with a second dopant type.

According to various examples of the second embodiments, the doped layer 15, and/or respectively doped layer 37, has a spatially uniform dopant density or a gradient dopant profile in a direction transverse to the plane surface of the substrate 1.

The invention enables fabrication of deep doped layer buried inside a monocrystalline semiconductor material. In turn, the invention enables fabrication of deep electronic junction devices at a low thermal budget.

The invention claimed is:

1. Process for manufacturing a deep junction electronic device comprising the steps of:
    a) Providing a substrate (1) of a monocrystalline semiconductor material, said substrate having a plane surface (9);
    b) Depositing a layer (5) of non monocrystalline semiconductor material on said plane surface (9), said layer (5) of non monocrystalline semiconductor material having an external surface (19);
    c) Incorporating inactivated dopant elements prior to step b) into said substrate (1) and/or, respectively, during or after step b) into said layer (5) of non monocrystalline semiconductor material, so as to form an inactivated doped layer (27) of monocrystalline semiconductor material and/or, respectively, an inactivated doped layer (7) of non monocrystalline semiconductor material;
    d) Exposing, after the step c), an area of said external surface (19) formed at step b) to a laser thermal anneal beam (30) having a density of energy higher than a determined threshold, so as to melt the layer (5) of non monocrystalline semiconductor material within a volume defined by said laser thermal anneal beam down to an interface with the substrate (1), and so as to activate said dopant elements incorporated at step c);
    e) Stopping exposure of said area to said laser thermal anneal beam so as to induce epi-like crystallization of said layer (5) of non monocrystalline semiconductor material from said interface (6, 8) with the substrate (1) and formation of epi-like monocrystalline semiconductor material (15) extending over said volume between said interface and said external surface (19), wherein said substrate (1) and/or, respectively, said epi-like monocrystalline semiconductor material (15), comprises a layer (17, 27) of activated doped monocrystalline semiconductor material.

2. Process for manufacturing a deep junction electronic device according to claim 1 wherein during step d) said laser beam (30) is an excimer laser beam having a laser wavelength in the range of absorption of said non monocrystalline semiconductor material.

3. Process for manufacturing a deep junction electronic device according to claim 2 further comprising another step of cleaning said surface (9) of the substrate (1) prior to step b), so as to remove any oxide layer from said surface (9).

4. Process for manufacturing a deep junction electronic device according to claim 1 wherein the step c) comprises a step c1) which is performed after step a) and prior to step b), said step c1) comprising exposure of said surface (9) of the substrate (1) to an ion implantation beam (40) so as to implant said inactivated dopant elements into the monocrystalline semiconductor substrate (1) and to form a layer (27) of monocrystalline semiconductor material doped by said inactivated dopant elements and extending from said plane surface (9) into the monocrystalline semiconductor substrate (1).

5. Process for manufacturing a deep junction electronic device according to claim 4 wherein the step c) comprises a step c2) which is performed during step b), said step c2) comprising the incorporation of dopant elements into the layer (5) of non monocrystalline semiconductor material.

6. Process for manufacturing a deep junction electronic device according to claim 5 wherein the layer (37) of activated doped monocrystalline semiconductor is doped with a first dopant type and the layer (17) of activated doped epi-like monocrystalline semiconductor is doped with a second dopant type.

7. Process for manufacturing a deep junction electronic device according to claim 5 further comprising another step of cleaning said surface (9) of the substrate (1) prior to step b), so as to remove any oxide layer from said surface (9).

8. Process for manufacturing a deep junction electronic device according to claim 4 wherein the step c) comprises a step c3) which is performed after the steps a) and b), said step c3) comprising exposure of said layer (5) of non monocrystalline semiconductor material to an ion implantation beam (40) so as to implant said inactivated dopant elements into the layer (5) of non monocrystalline semiconductor material and to form a layer (7) of non monocrystalline semiconductor material doped by said inactivated dopant elements.

9. Process for manufacturing a deep junction electronic device according to claim 8 wherein the layer (37) of activated doped monocrystalline semiconductor is doped with a first dopant type and the layer (17) of activated doped epi-like monocrystalline semiconductor is doped with a second dopant type.

10. Process for manufacturing a deep junction electronic device according to claim 4 further comprising another step of cleaning said surface (9) of the substrate (1) prior to step b), so as to remove any oxide layer from said surface (9).

11. Process for manufacturing a deep junction electronic device according to claim 1 further comprising another step of cleaning said surface (9) of the substrate (1) prior to step b), so as to remove any oxide layer from said surface (9).

12. Process for manufacturing a deep junction electronic device according to claim 1 wherein the semiconductor material is selected among silicon and germanium.

13. Process according to f claim 1 wherein said step c) of incorporating inactivated dopant elements is achieved so as to incorporate dopant elements with a gradient profile along a direction transverse to the plane surface (9) of the substrate (1).

14. Process for manufacturing a deep junction electronic device according to claim 1 wherein the layer (15) of epi-like monocrystalline semiconductor material has a thickness comprised between 500 nanometers and 3 micrometers.

15. Process for manufacturing a deep junction electronic device according to claim 1 wherein at step d) said laser beam is an excimer laser beam having an energy density in the range from 0.1 to 10 J/cm$^2$ and a laser wavelength lower than 600 nanometers.

16. Process for manufacturing a deep junction electronic device according to claim 1 wherein said steps d) and e) are performed in a gaseous atmosphere selected among an inert gas, air or vacuum and under controlled pressure and temperature.

17. Process for manufacturing a deep junction electronic device according to claim 1 further comprising a step of measuring an optical beam reflected on the external surface of the layer (5) of non monocrystalline semiconductor material so as to control full melt of said layer (5) of non monocrystalline semiconductor material during said step d), and so as to control epi-like crystallization of said layer (15) during said step e).

18. Process for manufacturing a deep junction electronic device according to claim 1 wherein the step c) comprises a step c3) which is performed after the steps a) and b), said step c3) comprising exposure of said layer (5) of non monocrystalline semiconductor material to an ion implantation beam (40) so as to implant said inactivated dopant elements into the layer (5) of non monocrystalline semiconductor material and to form a layer (7) of non monocrystalline semiconductor material doped by said inactivated dopant elements.

19. Process for manufacturing a deep junction electronic device according to claim 1 wherein the step c) comprises a step c2) which is performed during step b), said step c2) comprising the incorporation of dopant elements into the layer (5) of non monocrystalline semiconductor material.

20. Deep junction electronic device comprising a monocrystalline semiconductor substrate (1), said deep junction electronic device comprises a layer (15) of epi-like monocrystalline semiconductor material (15) having an external surface (19) and an interface (6,8) with said monocrystalline semiconductor substrate (1), and wherein said monocrystalline semiconductor substrate (1), and/or, respectively, said layer (15) of epi-like monocrystalline semiconductor material (15), comprises a layer (17, 27) of activated doped monocrystalline semiconductor material, wherein said interface (6, 8) is located at a depth comprised between 1 and 5 micrometers from said external surface, and wherein the doping profile of said layer (17, 27) of activated doped monocrystalline semiconductor material is a non-Gaussian profile.

* * * * *